(12) United States Patent  
Mathieu et al.

(10) Patent No.: US 10,586,740 B2
(45) Date of Patent: Mar. 10, 2020

(54) METHOD FOR MANUFACTURING PAIRS OF CMOS TRANSISTORS OF THE "FIN-FET" TYPE AT LOW TEMPERATURES

(71) Applicant: COMMISSARIAT A L'ENERGIE ATOMIQUE ET AUX ENERGIES ALTERNATIVES, Paris (FR)

(72) Inventors: Benoit Mathieu, Grenoble (FR); Perrine Batude, Dijon (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 0 days.

(21) Appl. No.: 16/191,951

(22) Filed: Nov. 15, 2018

(65) Prior Publication Data

US 2019/0157164 A1  May 23, 2019

(30) Foreign Application Priority Data

Nov. 23, 2017 (FR) ..................... 17 61089

(51) Int. Cl.
*H01L 21/82* (2006.01)
*H01L 21/8238* (2006.01)
(Continued)

(52) U.S. Cl.
CPC .. *H01L 21/823821* (2013.01); *H01L 21/0337* (2013.01); *H01L 21/266* (2013.01);
(Continued)

(58) Field of Classification Search
CPC ....... H01L 21/823821; H01L 29/66803; H01L 21/266; H01L 29/045; H01L 29/66795; H01L 21/0337; H01L 27/0924; H01L 21/823864; H01L 21/8221
See application file for complete search history.

(56) References Cited

U.S. PATENT DOCUMENTS 8,217,435 B2 * 7/2012 Chang ................... H01L 27/108
257/288
8,455,307 B2 * 6/2013 Cho ................ H01L 21/823431
257/288

(Continued)

OTHER PUBLICATIONS

U.S. Appl. No. 14/950,416, filed Nov. 24, 2015, 2016/0149039 A1, Shay Reboh et al.

(Continued)

*Primary Examiner* — William Coleman
(74) *Attorney, Agent, or Firm* — Oblon, McClelland, Maier & Neustadt, L.L.P.

(57) ABSTRACT

Method for producing a device provided with FinFET transistors, comprising the following steps:
a) making amorphous and doping a first portion of a semiconductor in via a tilted beam oriented toward a first lateral face of the fin, while retaining a first crystalline semiconductor block against a second lateral face of the fin, then
b) carrying out at least one recrystallization annealing of said first portion, then
c) making amorphous and doping a second portion via a tilted beam oriented toward the second lateral face of the fin, while retaining a second crystalline semiconductor block against said first lateral face of the fin, then
d) carrying out at least one recrystallization annealing of the second portion.

13 Claims, 6 Drawing Sheets

(51) Int. Cl.
  *H01L 21/822* (2006.01)
  *H01L 27/092* (2006.01)
  *H01L 21/033* (2006.01)
  *H01L 29/66* (2006.01)
  *H01L 29/04* (2006.01)
  *H01L 21/266* (2006.01)

(52) U.S. Cl.
  CPC .. *H01L 21/8221* (2013.01); *H01L 21/823828* (2013.01); *H01L 21/823864* (2013.01); *H01L 27/0924* (2013.01); *H01L 29/045* (2013.01); *H01L 29/66545* (2013.01); *H01L 29/66795* (2013.01); *H01L 29/66803* (2013.01)

(56) References Cited

U.S. PATENT DOCUMENTS 8,658,520 B2 * 2/2014 Aoyama ......... H01L 21/823418
    257/E21.09

2011/0027978 A1  2/2011  Hargrove et al.
2017/0133373 A1  5/2017  Tan et al.

OTHER PUBLICATIONS

U.S. Appl. No. 15/485,246, filed Apr. 12, 2017, 2017/0301692 A1, Perrine Batude et al.

U.S. Appl. No. 15/602,829, filed May 23, 2017, 2017/0345931 A1, Shay Reboh et al.

U.S. Appl. No. 16/191,951, filed Nov. 15, 2018, Benoit Mathieu, et al.

French Preliminary Search Report dated Aug. 30, 2018 in French Application 17 61089 filed on Nov. 23, 2017 (with English Translation of Categories of Cited Documents).

Veloso, A. et al. "Advances on doping strategies for triple-gate finFETs and lateral gate-all-around nanowire FETs and their impact on device performance," Materials Science in Semiconductor Processing 62, 2017, pp. 11.

* cited by examiner

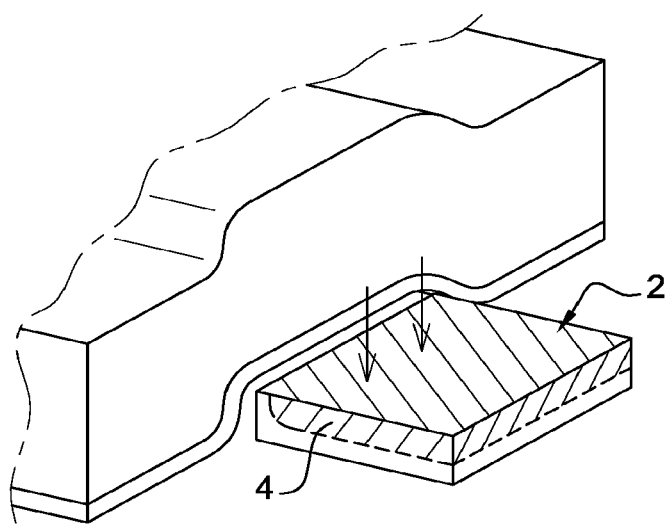
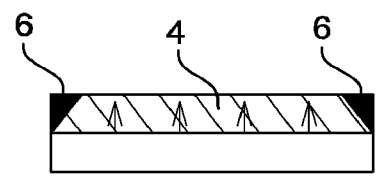
Fig. 1A  Fig. 1B
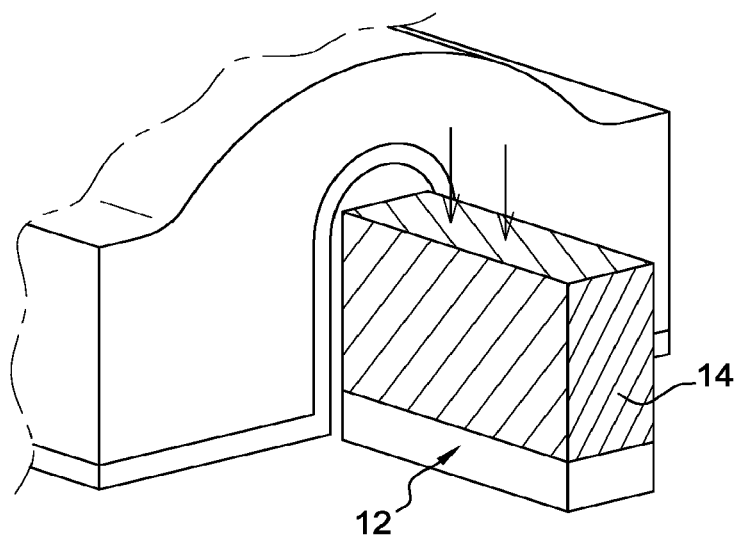
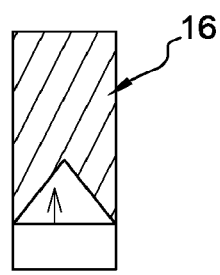
Fig. 2A  Fig. 2B

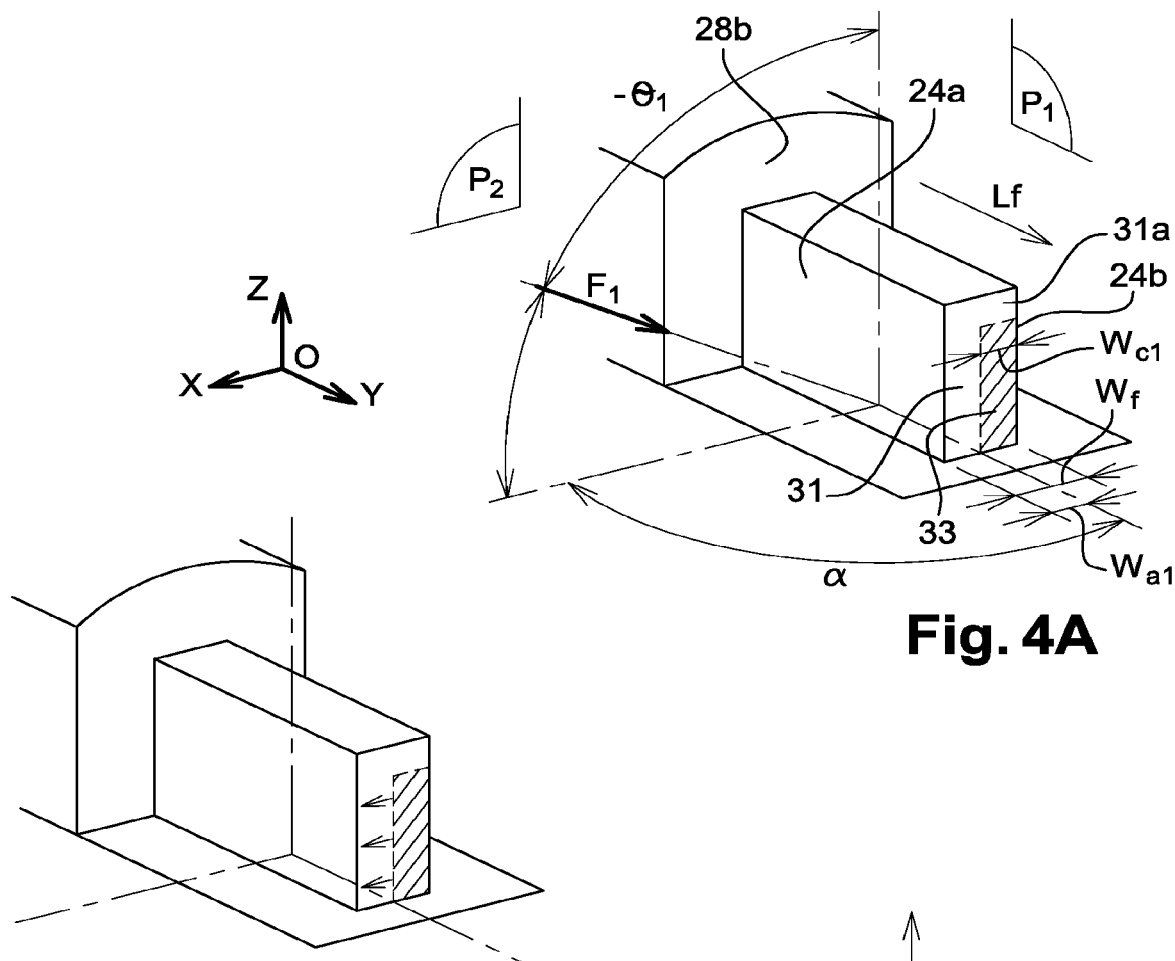
Fig. 4A
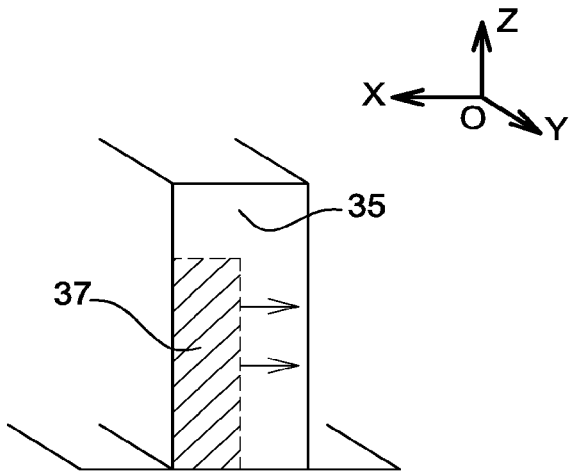
Fig. 4B
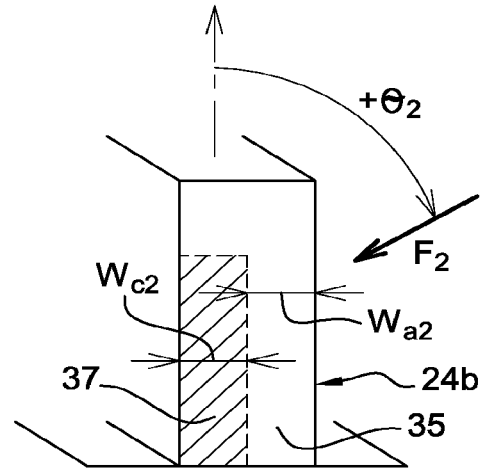
Fig. 4C
Fig. 4D

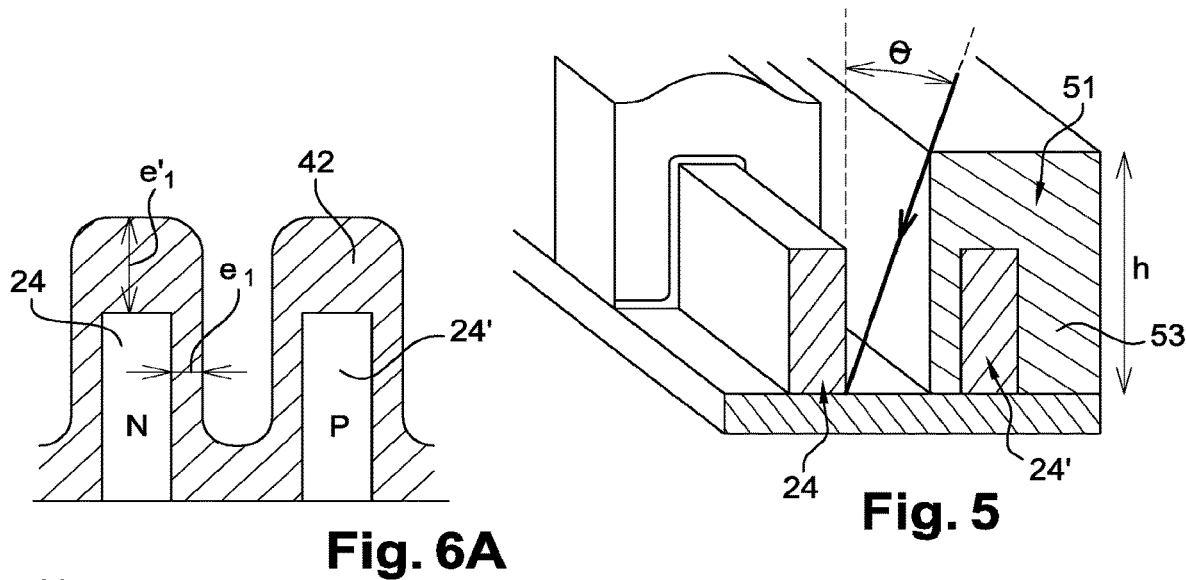
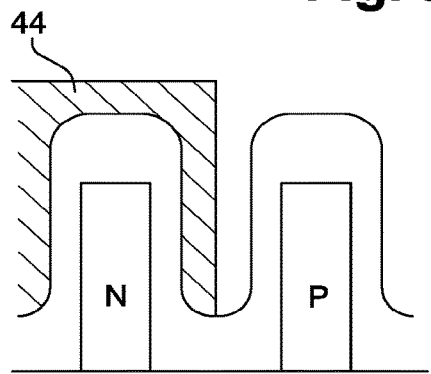
Fig. 6A
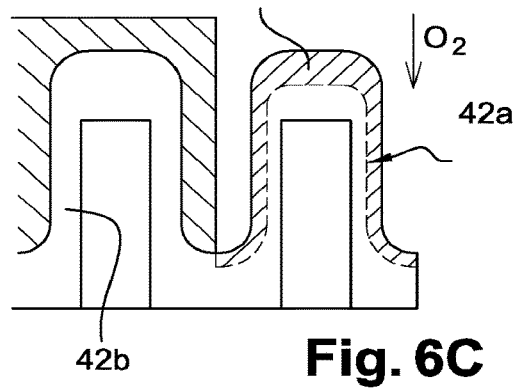
Fig. 5
Fig. 6B
Fig. 6C
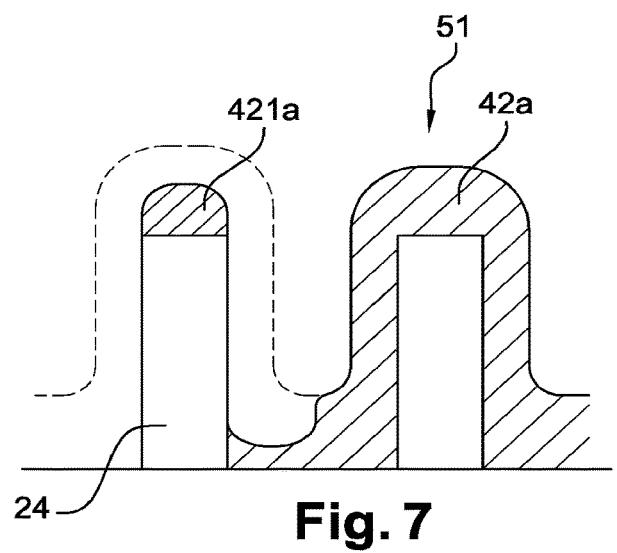
Fig. 7

US 10,586,740 B2

METHOD FOR MANUFACTURING PAIRS OF CMOS TRANSISTORS OF THE "FIN-FET" TYPE AT LOW TEMPERATURES

TECHNICAL FIELD AND PRIOR ART

The present application relates to the field of FinFET transistors (for Fin-shaped Field Effect Transistor), as well as that of devices including such transistors.

A finFET transistor is generally formed from at least a fin-shaped semiconductor portion, i.e., an elongated or oblong block that includes several distinct faces in the direction of its length and is typically parallelepiped. A portion of the fin is intended to form the channel of the transistor controlled by a gate electrode, generally described as coating.

The document "Advances on doping strategies for triple-gate finFETS and lateral gate all-around nanowire FETs and their impact on device performance" by Veloso et al., Materials Science in Semiconductor Processing 62 (2017) 2-12 describes an example embodiment of a coating gate finFET transistor.

For some applications, for example for the implementation of 3D circuits with transistors made on several levels, an effort is made to manufacture finFET transistors at low temperatures, i.e., at a temperature typically below 600° C.

The manufacture of transistors on the higher levels is made easier and potentially produces better quality transistors if a higher temperature can be used. Conversely, the higher the temperature is, the more the transistors on the lower levels are damaged by the heat treatments.

In this context, the doping and activation of the N and P dopants in the regions of the fin located on either side of the gate are problematic. The doping of regions of the fin intended to be located below insulating spacers arranged against the gate structure is particularly delicate. With the manufacturing methods known today, the upper acceptable temperature limit for the transistors of the lower layers is around 600° C., and preferably below 500° C. In all cases, this constraint cannot be respected by using only the diffusion mechanism.

One solution for carrying out doping and a low-temperature activation of source and drain regions of a planar transistor (i.e., the channel structure of which extends in a layer that is wider than it is thick) is to use another mechanism, such as the brief passage in a liquid phase. Thus, a low-temperature method consists of implanting dopants vertically (FIG. 1A) in a semiconductor layer 2 while making zones 4 of this layer partially amorphous, then (FIG. 1B) applying a heat treatment below 600° C. to re-crystallize, in solid phase, the zones 4 made amorphous while activating the dopants.

Small portions 6 arranged at the upper lateral edges of the semiconductor layer 2 may not re-crystallize correctly. Given the geometry of the final structure of the transistor, the impact of said poorly re-crystallized portions is negligible in the operation of the transistor.

Such a method is difficult to apply as is to a finFET transistor, as illustrated in FIGS. 2A-2B.

After having performed the vertical implantation of doping and a morphization (FIG. 2A) of the zone 14 of a silicon fin structure 12 of a finFET, said zone is recrystallized. The recrystallization front stops quickly while producing untimely facets 16 with crystalline orientation <111> (FIG. 2B).

The problem then arises of finding a new method, preferably at a low temperature, that allows the doping and activation of dopants with a finFET structure while providing improvements with respect to the aforementioned drawbacks.

BRIEF DESCRIPTION OF THE INVENTION

One aim of the present invention is to propose a new method for doping a semiconductor structure including one or several fins for the implementation of one or several finFET transistors.

One embodiment of the present invention provides a method comprising the following steps:

a) making amorphous and doping a first portion of a fin made from a crystalline semiconductor material using at least a first tilted implantation via a beam oriented toward a first lateral face of the fin, the first portion made amorphous and doped being arranged against the first lateral face and extending up to a given zone of the fin located between the first lateral face and a second lateral face of the fin opposite the first lateral face, a first crystalline semiconductor block being kept against the second lateral face of the fin, then b) carrying out at least one recrystallization annealing of said first portion, then c) making amorphous and doping a second portion of the fin using a tilted beam oriented toward the second lateral face of the fin, the second portion made amorphous and doped being arranged against the second lateral face and extending up to a given part of the fin located between the first lateral face and the second lateral face, a second crystalline semiconductor block being kept against the first lateral face of the fin, then d) carrying out at least one recrystallization annealing of the second portion.

The fin extends over a support in the sense of its length in a first direction Y, and a height measured in a second direction Z orthogonal to the first direction, the first direction Y and the second direction Z defining a plane P1 called "longitudinal plane" and that is normal to the primary plane of the support.

The beam during the first implantation can be oriented along a direction F1 forming a non-nil angle −θ1 with the second direction Z, the direction F1 of the beam being located in a plane P2, normal to the primary plane of the support and called "transverse plane". The transverse plane P2 is secant, or advantageously orthogonal, to the longitudinal plane P1.

The beam during the second implantation can be oriented along a direction F2 forming a non-nil angle +θ2 with the second direction Z.

Typically, the directions F1, F2 are such that θ1=θ2.

The second implantation is advantageously symmetrical to the second implantation [sic] relative to the longitudinal plane P1.

Preferably, the first and second implantations are done in directions located in the plane defined by the axes X and Z of an orthogonal coordinate system [O; X; Y; Z].

Such a method in which implantation is favored by the lateral faces of the fin can make it possible to create a recrystallization front in a direction <100> or <110>, depending on the chosen orientation of the channels of the transistors relative to the crystal of the layer of silicon. The proposed doping method makes it possible to avoid or at least limit the phenomenon of blocked facets during recrystallization. A more complete recrystallization of the fin is thus done relative to a method in which amorphization by vertical implantation is done.

Preferably, recrystallization annealing of the first portion and/or recrystallization annealing of the second portion is done at a temperature below 600° C., advantageously at a temperature below 500° C., the recrystallization annealing generally being done at a temperature above a minimum temperature necessary to begin recrystallization, which is typically above 450° C.

The proposed doping method makes it possible to perform doping at a low temperature.

During the first implantation and the second implantation, the fin may be covered by a transistor gate pattern.

Advantageously, the method may further comprise, after the annealing of the second portion, the formation of insulating spacers on either side of the gate pattern.

This embodiment, in which dopants are implanted before depositing the spacers, makes it possible to introduce dopants into portions of the fin located very close to the channel.

Such an embodiment is particularly suitable for the methods in which high-temperature annealing is not allowed, and is therefore integrated into so-called "cold" methods, in which the possibilities for diffusing dopants below the spacers are limited.

Furthermore, even if one next removed volumes of the fin in order to form, by epitaxy, source and drain regions, doped and/or exerting a stress on the channel structure, it will then be possible to keep these doped portions of the fin.

Thus, according to one advantageous embodiment, to form source and drain regions that are doped and/or that exert a stress, it is possible to provide, after forming insulating spacers, the following steps:

etching first volumes of the fin on either side of the insulating spacers, then forming semiconductor regions to replace said first volumes by growth of a semiconductor material that is doped and/or that has a mesh parameter different from the mesh parameter of said crystalline semiconductor material.

The gate pattern that one may provide on the fin structure during implantations is advantageously that of a sacrificial gate. In this case, the method further comprises, after formation of the insulating spacers, steps for:

removing the sacrificial gate pattern, forming a replacement gate between the spacers.

A following method according to the invention may be adapted to implementing N and P finFET transistors on a same substrate. Thus, when the doping of the fin is done, it is possible to provide for protecting at least one other fin from said doping.

In this case, the method may further comprise, before the first implantation, forming an implantation mask on said other fin.

Said implantation mask is advantageously made from silicon nitride.

Producing the implantation mask may comprise steps for:

forming a mask layer covering an upper face and lateral faces of the fin, selectively removing the mask layer on the lateral faces of said fin while preserving the mask layer on said other fin.

During the first implantation and the second implantation, an upper face of said fin may also be covered with a mask element. It is thus possible to implement a first implantation and/or a second implantation in which the block, the crystalline structure of which is kept, extends up to the upper face (in other words, up to the apex) of the fin.

Advantageously, the deposition of the mask layer is done such that the mask layer has a greater thickness $e'_1$ in a zone located on an upper face of the fins than in a zone located against the lateral faces of the fins.

A particular embodiment of the implantation mask provides a silicon nitride mask layer and steps for:

selective oxidation of a portion of the silicon nitride layer located across from said other fin, while protecting another portion of the silicon nitride layer located across from said fin, selective etching of said other portion of the nitride layer across from the oxidized portion of the silicon nitride layer.

A method according to the invention applies to the implementation of a device with finFET transistors distributed on a level of components and makes it possible to create more abrupt junctions than the usual methods using high-temperature diffusion annealing.

A method according to the invention more particularly adapts to the implementation of one or several finFET transistors of a 3D circuit, i.e., including several superimposed levels of transistors.

Thus, according to one embodiment of the method in which the device is a 3D circuit provided with levels of superimposed transistors, the FinFET transistor(s) being transistors of a given level $N_2$ of transistor(s) and the substrate including at least one level $N_1$ of transistors below the given level $N_2$ and having a channel region arranged in a first semiconductor layer, the first semiconductor layer being covered with at least one intermediate insulating layer between the fin made from crystalline semiconductor material and the first semiconductor layer.

BRIEF DESCRIPTION OF THE DRAWINGS

The present invention will be better understood upon reading the description of example embodiments, provided purely for information and non-limitingly, done in reference to the appended drawings, in which:

FIGS. 1A-1B illustrate an example method for low-temperature doping and activation of a planar transistor structure°;

FIGS. 2A-2B illustrate an example method for low-temperature doping and activation of a finFET transistor fin°;

FIGS. 4A-4D illustrate an example method according to the invention for low-temperature doping of a finFET transistor fin°;

FIG. 5 illustrates a particular embodiment of the method for implementing an N finFET transistor and a P finFET transistor on a same substrate°;

FIGS. 6A-6C illustrate the formation of an implantation mask able to protect one or several finFET transistor fins of a given type (N or P) during the doping of one or several other fins of finFET transistors of another type (P or N)°;

FIG. 7 illustrates another particular example embodiment of the implantation mask°;

Identical, similar or equivalent parts of the various figures bear the same numerical references so as to facilitate the passage from one figure to the next.

The different parts shown in the figures are not necessarily shown using a uniform scale, to make the figures more legible.

Furthermore, in the description below, terms that depend on the orientation of the structure such as "on", "above", "vertical", "tilted", "lateral", "upper", "lower", apply considering that the structure is oriented in the manner illustrated in the figures.

DETAILED DESCRIPTION OF THE INVENTION

Figure 3A:
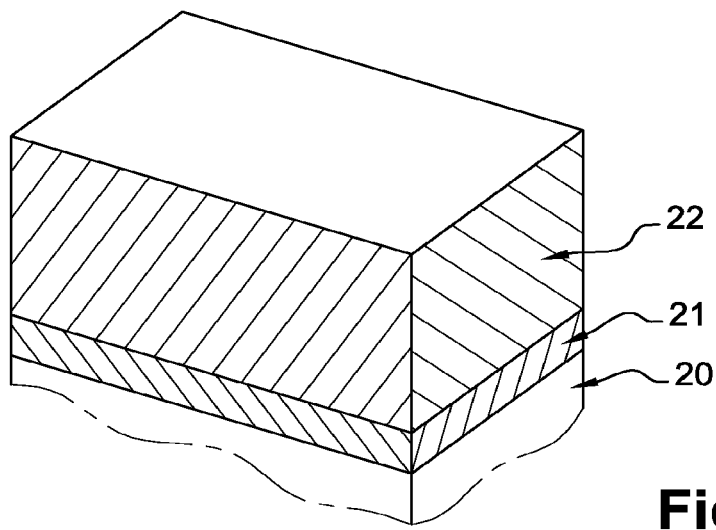
FIGS. 3A-3C illustrate an example of manufacturing a fin structure°.
Figure 3B:
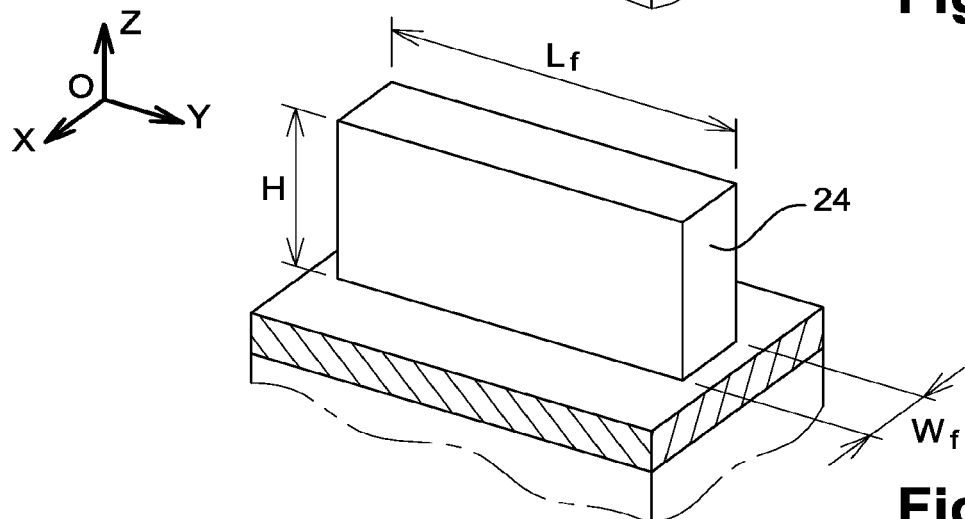

Reference will now be made to FIG. 3A, which shows a possible starting structure of an example method for producing one or several finFET transistors.

This structure is in the form of a semiconductor on insulator-type substrate, in particular of the SOI (Silicon On Insulator) type, with a semiconductor support layer 20, and an insulating layer 21 that may be of silicon oxide and is arranged on and in contact with the support layer 20. The insulating layer 21 of the substrate is in particular a layer of the BOX (Buried Oxide) type, on which a superficial semiconductor layer 22 made from semiconductor material, in this example silicon, is arranged. The superficial semiconductor layer 22 has a thickness typically comprised between 20 and 100 nm, for example at least 35 nm.

Figure 3C:
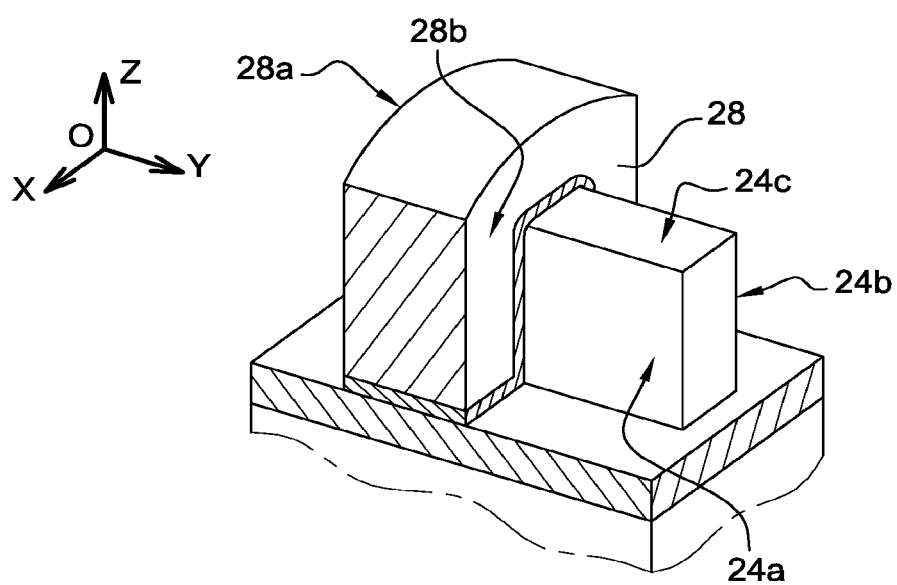

Next, etching of the surface layer 22 is done to form at least one fin 24 that may assume the form of a parallelepiped or substantially parallelepiped block intended to accommodate a channel region of a transistor of the finFET type (FIG. 3C).

The fin 24 is typically provided with a form ratio, in other words a ratio of its width Wf (dimension measured parallel to the axis X of an orthogonal coordinate system [O; X; Y; Z]) to its height H (dimension measured parallel to the axis Z); that is less than 1.

Next, a sacrificial gate 28 is formed, for example made from polysilicon, coating a region of the fin 24 in which the channel structure of the finFET transistor is provided. The sacrificial gate 28 is, in the example illustrated in FIG. 3C, arranged so as to cover zones respectively of an upper face 24c and lateral faces 24a, 24b of the fin.

Next, regions of the fin that are exposed and are not covered by the sacrificial gate 28 are doped. Preferably, the doping is done using a small thermal budget.

To that end, a method according to the invention is provided, an example embodiment of which is illustrated in FIGS. 4A-4D.

At least a first tilted ion implantation of the fin 24 is done using a beam tilted by direction F1 oriented toward a first lateral face 24a of the fin 24 (FIG. 4A). The direction F1 of the implantation beam forms a non-nil tilt angle $-\theta_1$ relative to a given plane P1 that will be called "longitudinal plane".

The longitudinal plane P1 is a plane normal to the primary plane of the substrate of the fin 24 and that extends parallel to the axis Y along which the length of the fin 24 (in other words the largest dimension of the fin outside its thickness) is measured. "Primary plane" of the substrate refers to a plane passing through the substrate and is parallel to the plane [O; X; Y] given in FIG. 4A. The longitudinal plane P1 is therefore a plane parallel to the plane [O; Y; Z]. In the specific example embodiment illustrated in FIG. 4A, the lateral faces 24a, 24b of the fin 24 are parallel or substantially parallel to the longitudinal plane P1.

The direction of the implantation beam is defined in a plane P2 called "transverse plane", which is also normal to the primary plane of the substrate and intersects the longitudinal plane P1. Typically, the plane P2 in which the direction F1 of the implantation beam is located forms an angle α of 90° relative to the longitudinal plane P1.

Preferably, the transverse plane P2 in which the beam is located is parallel to the lateral faces 28a, 28b of the sacrificial gate 28. In this way, the sacrificial gate 28 does not create a shadow of the beam and the fin 24 can thus advantageously be doped and made amorphous in a portion extending over the entire height H of the fin 24.

The implantation parameters, in particular the implantation energy and the dose, are provided so as to implement a partial amorphization of the fin 24 in a first given portion 31 located against a first lateral face 24a of the fin 24 by which the beam F1 penetrates first among the lateral faces 24a, 24b of the fin.

The partial amorphization of the fin 24 is done such that a first block 33 of crystalline material is retained. This block 33 can be delimited between a second lateral face 24b of the fin opposite the first face 24a and a zone located in the volume of the fin 24. Preferably, the implantation energy is chosen such that the portion 31 made amorphous has a width Wa1 (dimension measured parallel to the axis X in FIG. 4A) that is about half or greater than half of the total width Wf of the fin 24. The retained crystalline block 33 may for example have a width Wc1 of several nanometers, for example around 3 or 4 nm for a fin with a width Wf of about 7 nm.

The first implantation is done using at least one doping species, for example boron, or phosphorus or arsenic, in order to perform N or P doping. The concentration of dopants may for example be between 1E20 and 5E20 atoms/cm$^3$.

Advantageously, the first doping species implantation may be done in part or completed by that of a non-doping species, i.e., that does not produce excess electrons or holes in the semiconductor material of the fin 24. The selected non-doping species is preferably heavier than the doping species in order to favor amorphization. It is for example possible to choose Si or Ge atoms as non-doping species.

The doping implantation and amorphization are preferably done with a strong tilt, the tilt angle $\theta_1$ preferably being greater than 15° and typically between 30° and 85°, advantageously between 30° and 45°. The use of the largest possible angle makes it possible to reduce the roughness of the interface between the portion 31 made amorphous and the block 33 kept crystalline and thus to obtain a more planar amorphous/crystalline interface. This also makes it possible to obtain a better distribution of the dopants and to decrease rebound effects of the implanted species against the lateral face 24a through which the beam penetrates. This can also make it possible to reduce the expanse of a portion 31a made amorphous and located above the block 33, the crystalline structure of which is retained. The maximum usable implantation angle can be limited such that the adjacent structures do not create a shadow and make it possible to dope the entire height of the fin structure. This maximum angle depends on the height of the fin, and the height and distance of the closest adjacent structures.

Once the portion 31 is made amorphous and doped, a heat treatment is done, preferably at a low temperature, so as to activate the dopants by solid-phase epitaxial regrowth (SPER) while limiting the heat budget used. Annealing is thus done at a temperature typically comprised between 450° C. and 600° C., preferably below Tmax, advantageously between 500° C. and 600° C.

The heat treatment leads to recrystallization of the portion 31 made amorphous, using the block 33 of crystalline semiconductor material as starting zone for a recrystallization front (FIG. 4B). A recrystallization front in a crystallographic direction <100> or <110> is created and advantageously does not produce a blocked facet.

Then, after recrystallization, at least one second tilted ion implantation of the fin 24 is done. The second ion implantation serves to dope and make amorphous another side of the fin structure 24. The second implantation is therefore this time oriented toward a second lateral face 24b of the fin 24 opposite the first lateral face 24a (FIG. 4C).

The second tilted ion implantation of the fin 24 is thus done using a beam with direction F2 forming a non-nil tilt angle +$\theta_2$ relative to the longitudinal plane P1 and located in the transverse plane P2 or a plane parallel to said transverse plane P2.

Preferably, the tilt angle $\theta_2$ of the second implantation is provided such that $\theta_2=\theta_1$. Advantageously, the direction F2 of the beam during the second implantation is symmetrical to that F1 of the beam during the first implantation relative to the longitudinal plane P1. The beam during the second implantation may thus also be oriented in a direction F2 parallel to the lateral flanks 28a, 28b of the sacrificial gate 28.

The second implantation is also implemented using a doping species and done so as to produce a partial amorphization of the fin 24. Typically, the same doping species is or are used for the first implantation.

The partial amorphization is done such that a portion 35 located against the second lateral face 24b is made amorphous and doped while a block 37 of crystalline material is kept against the first lateral face 24a. Preferably, the implantation energy is chosen such that the portion 35 made amorphous has a width Wa1 that is about half or greater than half of the total width Wf of the fin 24. The retained crystalline block 37 may for example have a width Wc2 of several nanometers, for example around 3 or 4 nm for a fin with a width Wf of about 7 nm. The implantation energy may be of the same order as or identical to that used during the first implantation. The portion 35 made amorphous preferably extends over the entire height H of the fin 24. Like for the first implantation, one particular embodiment provides for performing the second implantation in part with a non-doping species or completing the second implantation with that of a non-doping species.

Once this amorphization and doping are done, at least one second low-temperature heat treatment is done in order to activate the dopants. A solid phase epitaxial recrystallization (SPER) may be carried out through annealing at a temperature between 450° C. and 600° C. As illustrated in FIG. 4D, the block 37 serves as starting zone for a recrystallization front.

This doping method, with a reduced heat budget, and during which the fin structure 24 is implanted by its lateral faces 24a and 24b rather than vertically, makes it possible to obtain more complete doping of the fin 24 while allowing complete recrystallization of the fin and reducing the presence of crystalline flaws in the recrystallized fin 24.

To carry out a method as previously described, once the tilt angle and the amorphization depth are defined, one skilled in the art can use simulation software such as the S-process™ tool by the company Synopsys in order to best define the implantation parameters of the fin, in particular energy, dose.

Different implantation conditions will be given, as an example, for a finFET transistor having a gate 12 nm wide.

By using a tilt angle of 45°, the amorphization and doping of the fin can be done by implantation using Germanium done at an energy between 2 keV and 3 keV at a dose of 5E14 atoms/cm², followed by doping by Boron implantation at a dose between 3E14 and 6e14 atoms/cm² and with an energy of about 2 keV.

By this time using a tilt angle of 30°, the amorphization of a fin can be done by implantation using Germanium done at an energy between 4 and 5 keV at a dose of 5E14 atoms/cm², followed by Boron implantation at a dose between 3E14 and 6e14 atoms/cm² and an energy between 3 and 4 keV.

The successive first implantation, first annealing, second implantation, second annealing steps that were previously described in connection with FIGS. 4A, 4B, 4C, 4D make it possible to perform doping of a given type, N or P, of the fin 24. Yet the device one wishes to implement may comprise N and P finFET transistors on a same substrate. In this case, during the aforementioned steps, at least one other fin 24' for which one wishes to impart a type of conductivity, P or N, opposite that of the fin 24 may be protected by an implantation mask. As illustrated in FIG. 5, the choice of the tilt angle $\theta$ of another adjacent fin 24 may depend on the thickness of such an implantation mask 51 on a fin 24'.

Once the doping of the fin 24 is done, to produce doping of the opposite type on the other adjacent fin 24', the mask 51 is removed and another mask is formed, this time on the fin 24 previously doped.

A similar sequence of steps as described in connection with FIGS. 4A to 4D is then reiterated, this time with at least one other doping species suitable for carrying out doping of the type opposite the other fin 24'.

To be able to carry out doping by implantation as for example described in connection with FIGS. 4A and 4C of the fin 24 with a large enough tilt angle $\theta$, while avoiding doping the other fin 24', the mask 51 is preferably provided with a limited height h. The material 53 of the mask 51 is therefore chosen with a base of a material 53 capable of having a high power to stop ions while having a small thickness. The material 53 is preferably also chosen so as to be able to withstand the heat treatment steps previously described in connection with FIGS. 4B, 4D. In as much as it is preferable to limit the number of photolithography steps, it is in fact advantageously desirable to be able to keep the mask 51 throughout the entire sequence of steps for first implantation, first annealing, second implantation, second annealing, described in connection with FIGS. 4A to 4D. Thus, the chosen material 53 is preferably different from the standard lithography resins typically used as implantation mask. The stopping power of such resins is low at a reduced thickness or requires the use of an excessive thickness. Furthermore, such resins generally do not withstand heat treatments, even at a temperature close to 500° C.

To meet the aforementioned criteria, it is possible to provide a mask 51 for example made from silicon nitride.

One example embodiment of such an implantation mask is illustrated in FIGS. 6A-6C.

A mask layer 42 is first formed, for example from silicon nitride, covering an upper face and lateral faces of the fins 24, 24' arranged next to one another (FIG. 6A). The deposition is preferably non-conform, i.e., with a non-constant thickness of the mask layer 42. Advantageously, the mask layer 42 is provided with a thickness e'1 in a region located on the upper face of the fins greater than that e1 on the lateral faces of the fins 24, 24'.

Next, a selective removal is performed of a zone of the mask layer 42 located around the fin 24, so as to expose its lateral faces, while preserving the mask layer 42 on the other fin 24'.

To perform such a selective removal, it is first possible (FIG. 6B) to form a mask 44, typically from photoresist, on the fin 24 while the other fin 24' covered with the mask layer 42 is not protected by said mask 44.

Next, an oxidation is performed of a thickness 43 of a portion 42a of the mask layer 42 located across from the fin 24' (FIG. 6C). Another part of this mask layer 42 covered by the mask 44 is then protected from oxidation.

Next, the resin mask 44 is removed by stripping.

Then, the non-oxidized portion of the layer 42 is etched by silicon nitride, typically using $H_3PO_4$. The oxidized thickness 43 of the other portion 42b of the layer 42 of silicon nitride in turn withstands the etching process.

At the end of this etching, as illustrated in the example embodiment of FIG. 7, it is advantageously possible to preserve an element 421a of the mask layer 42 on the upper face of the fin not protected by the oxidized thickness. Such a mask element 421a may in particular be obtained in the case where a non-conform deposition of the mask layer has been done, then preferably isotropic etching of said mask layer 42.

Alternatively, in order to etch the mask layer 42 while preserving a mask element 421a on the apex of the fin 24, it is possible to perform dry plasma etching by using equipment making it possible to tilt the substrate on which the fins 24, 24' are arranged relative to the plasma. The portion 42a of the mask layer 42 that one wishes to preserve may in this case be covered by a resin mask.

Preserving a mask element 421a on the upper face of the fin 24 may make it possible to reduce the expanse of the portion 31a illustrated in FIG. 4A that has been made amorphous during the tilted implantation step previously described and that is located above the block 33 whereof the crystalline structure has been retained. Thus, if one manages to reduce this portion and optionally to obtain a crystalline block 33 going up to the upper face (in other words up to the apex) of the fin 24, one next obtains a better recrystallization of the fin 24. This may make it possible to reduce, in the final structure of the transistor, the resistances of the access regions to the channel.

It is possible to adjust the thickness of the mask element 421a preserved on the upper face of the fin 24 based on the implantation conditions and in particular the chosen tilt angle.

It is also possible to adapt the thickness of the mask in the portion 42a covering the other fin 24' and that one wishes to preserve from the doping by implantation. This thickness of the portion 42a is also adjusted based on the implantation conditions, and in particular the chosen tilt angle. Too small of thickness would allow dopants to enter, while too large a thickness would limit the implantation angle.

For the aforementioned examples of implantation conditions, with a tilt angle of 45°, an element 421a made from silicon nitride with a thickness of about 3-4 nm may be preserved on the fin 24 in order to retain a non-a morphized block over the entire height of the fin 24. For a tilt angle of about 30°, it is possible to provide a thickness of 5 to 6 nm of silicon nitride.

To prevent boron implantation in the fin 24', which must be protected, when an energy implantation at 2 keV and a tilt angle of 45° are used, a mask layer 42 of silicon nitride with a thickness of at least 12 nm is for example provided on the fin 24'.

When an energy implantation at 4 keV and a tilt angle of 30° are used, a mask layer 42 of silicon nitride with a thickness of at least 15 nm is for example provided on the fin 24'.

The method for doping a fin previously described in connection with FIGS. 4A-4D particularly adapts to the doping of so-called access regions to the channel of a finFET transistor, which are regions located on either side of the zone of the fin 24 covered by the gate. Said access regions are typically located below insulating spacers 83 formed like in FIG. 8 on either side of the gate. To allow the doping of the access regions, the spacers 83 are formed preferably after the sequence of steps described in connection with FIGS. 4A-4D.

Figure 8A:
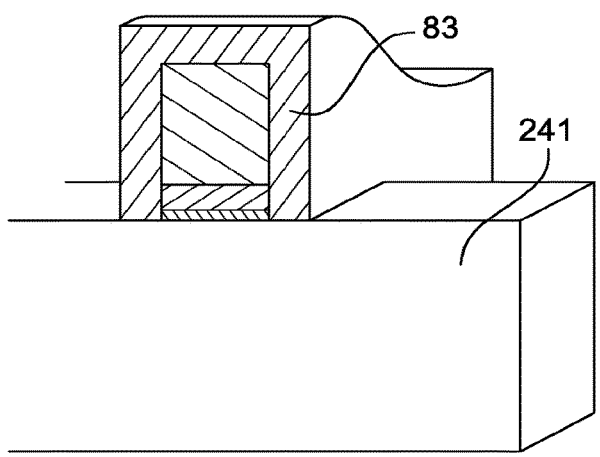
FIGS. 8A-8C illustrate a particular example embodiment of source and drain blocks able to exert a stress on a fin-forming channel structure of a finFET transistor°.

An example method for producing source and drain blocks that are doped and/or able to exert a stress on a doped fin structure 24 as illustrated in FIG. 8A will now be described.

Figure 8B:
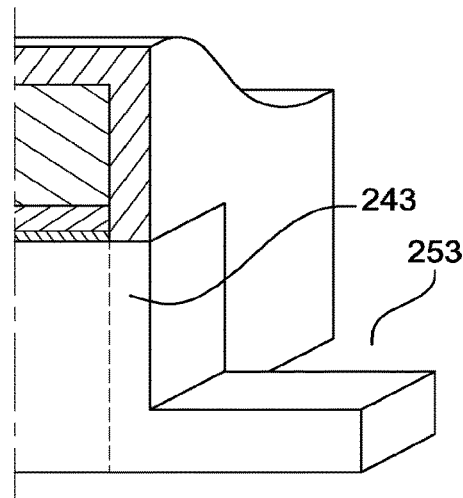

First, portions 241 of the fin 24 located on either side of the spacers 83 are removed (FIG. 8B).

This removal can be done using anisotropic etching, for example using HCl, and makes it possible to form cavities 253. Preferably, a portion 243 of the fin that has been doped using the method previously described in connection with FIGS. 4A-4D is retained below the spacers 83.

Figure 8C:
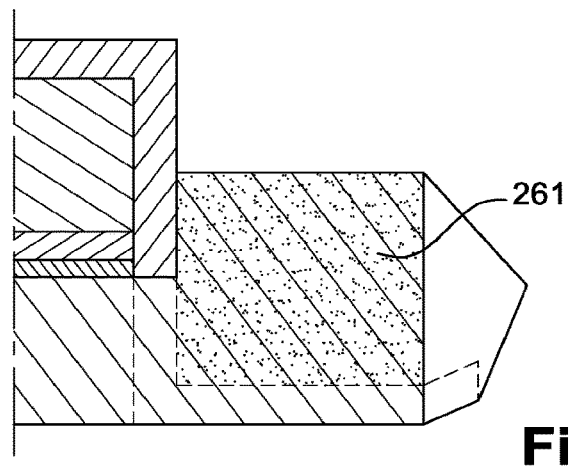

Next, epitaxy is used to grow a replacement semiconductor material 261 filling in the cavities 243 (FIG. 8C). This semiconductor material 261 can be doped in situ, i.e., during the epitaxial growth.

The semiconductor material 261 is preferably a crystalline semiconductor material having a mesh parameter different from that of the material making up the rest of the fin 24, so as to be able to produce source and drain regions exerting a stress on the channel region. Typically, when the fin 24 is initially made from silicon, the semiconductor material 261 that is grown is made from silicon germanium.

Figure 9:
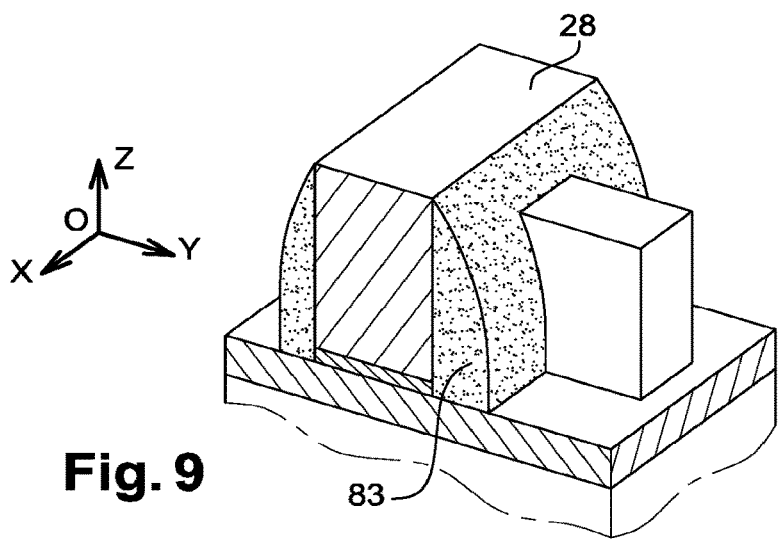
FIG. 9 illustrates an example embodiment of insulating spacers on a fin after doping thereof°.

In the example embodiment illustrated in FIG. 9, the insulating spacers 83, typically made from silicon nitride, are formed against a sacrificial gate 28 that will be replaced later.

The implementation of finFET transistors gates to which a doping method as previously described applies may in turn follow a gate manufacturing method of the "gate last" type. In this case, the sacrificial gate 28 that in particular made it possible to establish the doping of the access regions to the channel and to introduce dopants as close as possible to the channel is then etched between the spacers 83 and replaced by a final gate stack. A replacement gate is then formed after the doping and the activation of the dopants in the fin(s). This replacement gate is preferably made after the formation of source and drain regions.

A method for manufacturing N and/or P finFET transistors as previously described is particularly suitable for integration into a 3-dimensional or 3D integrated circuit.

In such circuits, transistors are distributed over several levels of semiconductor layers. By using a low-temperature doping method as described in connection with FIGS. 4A-4D, it is possible to incorporate one or several finFET transistors into a higher level of a device already comprising one or several levels of transistors.

Figure 10A:
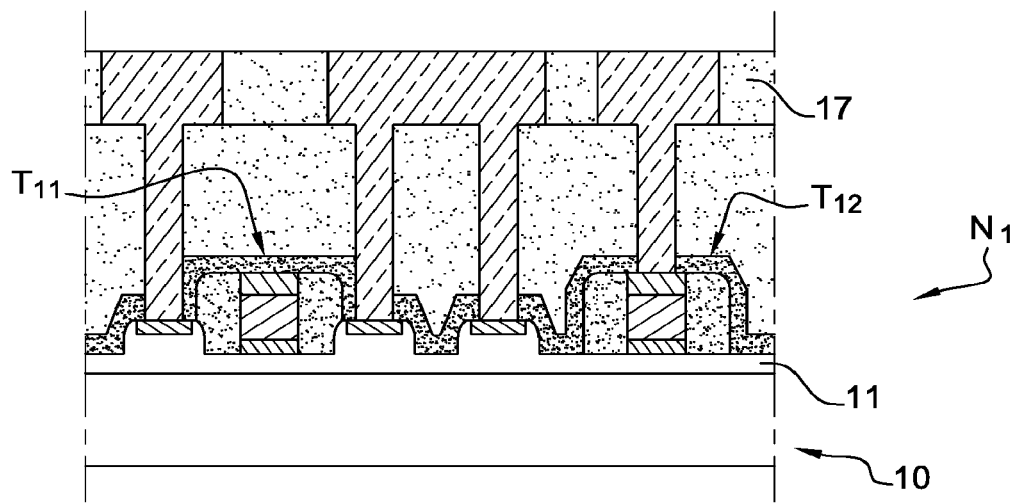
FIGS. 10A-10C illustrate a particular embodiment for the implementation of a 3D circuit and in which the semiconductor layer including the finFET transistors is attached on a substrate already provided with at least one other semiconductor layer in which transistors have been formed.

An example method provides for starting from a structure as illustrated in FIG. 10A and already provided with at least one level $N_1$ of transistors $T_{11}$, $T_{12}$ whereof the channel region extends in a semiconductor layer 11 resting on a substrate 10.

Next, an attachment and securing are done on this structure, for example by molecular gluing, of a substrate including a semiconductor layer 122 in which one or several finFET transistors are able to be formed. Said semiconductor layer 122 can for example be arranged on a sacrificial handle substrate made up of a semiconductor support layer 120 and an insulating layer 121 for example made from silicon oxide.

The transfer by gluing is preferably done at a low temperature, for example between 100° C. and 650° C., and advantageously below 450° C., so as not to damage the connection elements and transistors of the lower level $N_1$.

Figure 10B:
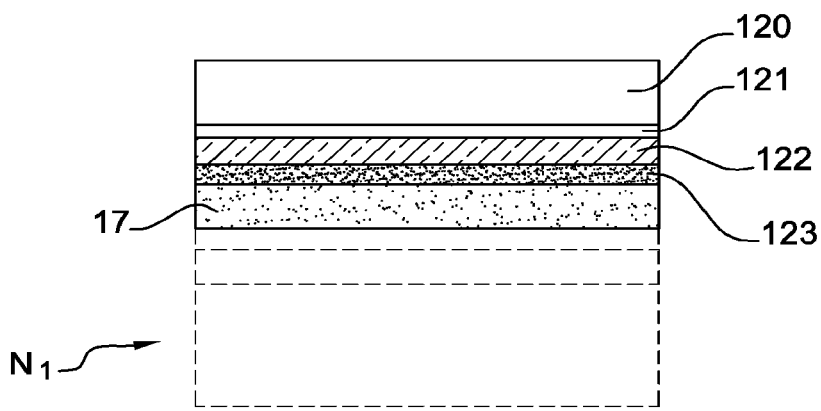

In the example illustrated in FIG. 10B, to facilitate the assembly, the semiconductor layer 122 is covered with an insulating layer, typically made from silicon oxide that is attached on another insulating layer 17, covering the first level $N_1$ of transistors. This other insulating layer 17 is typically made from silicon oxide, gluing of the oxide on oxide type then being able to be done.

Figure 10C:
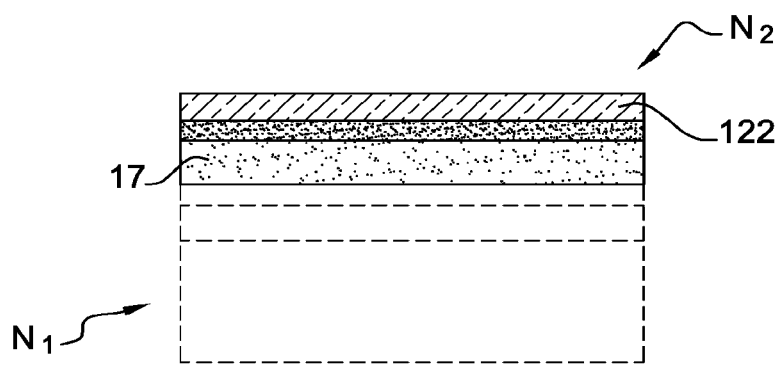

It is next possible to remove the layers 120, 121 from the handle substrate (FIG. 10C). One then has a semiconductor layer 122 in which it is possible to form one or several fins 24 and/or 24' that may be made to undergo a doping method as previously described.

The invention claimed is:

1. A method for producing a device provided with one or several FinFET transistor(s) comprising the following steps:
   a) making amorphous and doping a first portion of at least one semiconductor structure comprising a fin made from a crystalline semiconductor material and extending over a substrate in the direction of its length in a first direction Y, the fin having a height measured in a second direction Z orthogonal to the first direction, the first direction Y and the second direction Z being parallel to a longitudinal plane P1 normal to the primary plane of the substrate, the first portion being made amorphous and doped using at least a first tilted implantation via a beam oriented toward a first lateral face of the fin and along a direction forming a non-nil angle −θ1 with the second direction Z, the direction of the beam being located in a transverse plane, the transverse plane being normal to the primary plane of the support and secant, or advantageously orthogonal, to the longitudinal plane, the first portion made amorphous and doped being arranged against the first lateral face and extending up to a given zone of the fin located between the first lateral face and a second lateral face opposite the first lateral face, a first crystalline semiconductor block being kept against the second lateral face of the fin, then
   b) carrying out at least one recrystallization annealing of said first portion, then
   c) making amorphous and doping a second portion of the fin using a beam oriented toward the second lateral face of the fin and along a direction forming a non-nil angle +θ2 with the second direction Z, the second portion made amorphous and doped being arranged against the second lateral face and extending up to a given part of the fin located between the first lateral face and the second lateral face, a second crystalline semiconductor block being kept against the first lateral face of the fin, then
   d) carrying out at least one recrystallization annealing of the second portion.

2. The method according to claim 1, wherein during the first implantation and the second implantation, the fin may be covered by a transistor gate pattern.

3. The method according to claim 1, wherein the semiconductor structure comprises another fin, adjacent to said fin, the method further comprising, before the first implantation, forming an implantation mask on said other fin.

4. The method according to claim 1, wherein during the first implantation and the second implantation, an upper face of said fin is covered with a mask element.

5. The method according to claim 1, wherein the recrystallization annealing of the first portion and/or the recrystallization annealing of the second portion is done at a temperature below 600° C.

6. The method according to claim 1, wherein the device is a 3D circuit provided with levels of superimposed transistors, the FinFET transistor(s) being transistors of a given level of transistor(s) and the substrate including at least one level of transistors below the given level and having a channel region arranged in a first semiconductor layer, the first semiconductor layer being covered with at least one intermediate insulating layer between the fin made from crystalline semiconductor material and the first semiconductor layer.

7. The method according to claim 2, the method further comprising, after the annealing of the second portion, the formation of insulating spacers on either side of the gate pattern.

8. The method according to claim 7, the method further comprising, after formation of the insulating spacers, steps for:
   etching first volumes of the fin on either side of the insulating spacers, then
   forming semiconductor regions to replace said first volumes by growth of a semiconductor material that is doped and/or that has a mesh parameter different from the mesh parameter of said crystalline semiconductor material.

9. The method according to claim 7, wherein the gate pattern is that of a sacrificial gate, the method further comprising, after formation of the insulating spacers, steps for:
   removing the sacrificial gate pattern,
   forming a replacement gate between the spacers.

10. The method according to claim 3, wherein the production of the implantation mask comprises the following steps:
    forming a mask layer covering an upper face and lateral faces of the fin,
    selectively removing the mask layer on the lateral faces of said fin while preserving the mask layer on said other fin.

11. The method according to claim 3, wherein the implantation mask is made from silicon nitride.

12. The method according to claim 10, wherein the deposition of the mask layer is done such that the mask layer has a greater thickness in a zone located on an upper face of the fins than in a zone located against the lateral faces of the fins.

13. The method according to claim 10, wherein the mask layer is a layer of silicon nitride, the method further comprising the following steps:
    selective oxidation of a portion of the silicon nitride layer located across from said other fin, while protecting another portion of the silicon nitride layer located across from said fin,
    selective etching of said other portion of the nitride layer across from the oxidized portion of the silicon nitride layer.

* * * * *